US012264776B2

(12) United States Patent
Stevens

(10) Patent No.: US 12,264,776 B2
(45) Date of Patent: Apr. 1, 2025

(54) DISPLAY STAND APPARATUS FOR AN ELECTRONIC DEVICE

(71) Applicant: Zachary Stevens, Toms River, NJ (US)

(72) Inventor: Zachary Stevens, Toms River, NJ (US)

(*) Notice: Subject to any disclaimer, the term of this patent is extended or adjusted under 35 U.S.C. 154(b) by 0 days.

(21) Appl. No.: 18/220,719

(22) Filed: Jul. 11, 2023

(65) Prior Publication Data
US 2025/0020270 A1 Jan. 16, 2025

(51) Int. Cl.
F16M 13/00 (2006.01)
G06F 1/16 (2006.01)
H05K 9/00 (2006.01)

(52) U.S. Cl.
CPC ......... F16M 13/005 (2013.01); G06F 1/1656 (2013.01); H05K 9/0054 (2013.01)

(58) Field of Classification Search
None
See application file for complete search history.

(56) References Cited

U.S. PATENT DOCUMENTS

| | | | | |
|---|---|---|---|---|
| D128,172 S | * | 7/1941 | Morgan | D19/91 |
| 6,971,622 B2 | * | 12/2005 | Ziegler | H04M 1/12 248/455 |
| 8,464,995 B2 | * | 6/2013 | Yang | F16M 13/00 248/455 |
| D729,253 S | | 5/2015 | Nyholm | |
| 9,521,788 B2 | | 12/2016 | McConnell | |
| 10,090,578 B2 | | 10/2018 | Wolentarski | |
| 10,698,452 B2 | * | 6/2020 | Fenton | G06F 1/1607 |
| 11,314,280 B2 | * | 4/2022 | Ferren | F16M 13/022 |
| 2010/0072334 A1 | * | 3/2010 | Le Gette | F16M 11/10 29/428 |
| 2011/0279962 A1 | * | 11/2011 | Chiang | F16M 11/2021 361/679.01 |
| 2012/0305735 A1 | * | 12/2012 | McSweyn | H04M 1/04 156/60 |
| 2014/0263940 A1 | * | 9/2014 | Wang | F16M 11/38 248/688 |
| 2015/0349828 A1 | | 12/2015 | Dyson, III | |
| 2016/0295716 A1 | * | 10/2016 | Chen | F16M 11/041 |
| 2017/0064852 A1 | * | 3/2017 | Mercier | F16M 13/00 |
| 2019/0288724 A1 | | 9/2019 | Lehmann | |
| 2020/0328770 A1 | | 10/2020 | She | |
| 2022/0120375 A1 | * | 4/2022 | Holder | F16M 11/048 |

FOREIGN PATENT DOCUMENTS

WO WO2017030888 2/2017

* cited by examiner

Primary Examiner — Steven M Marsh

(57) ABSTRACT

A display stand apparatus for supporting an electronic device on a support surface and blocking electromagnetic radiation emitted by the electronic device includes a case with an electromagnetic field (EMF) shield for blocking the electromagnetic radiation. A support is attached to the case which is deployable to position the electronic device on the support surface. The support has an appearance of an animal and has a pivoting prop that appears as an appendage of the animal.

10 Claims, 7 Drawing Sheets

DISPLAY STAND APPARATUS FOR AN ELECTRONIC DEVICE

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

The disclosure relates to display stand apparatuses and more particularly pertains to a new display stand apparatus for supporting an electronic device on a support surface and blocking electromagnetic radiation emitted by the electronic device.

(2) Description of Related Art Including Information Disclosed Under 37 CFR 1.97 and 1.98

The prior art describes multiple examples of cases for housing an electronic device and blocking electromagnetic radiation emitted by the electronic device. However, the prior art does not disclose such an apparatus which provides a pivoting stand that facilitates displaying the electronic device on a support surface and has an appearance of an animal.

BRIEF SUMMARY OF THE INVENTION

An embodiment of the disclosure meets the needs presented above by generally comprising a case with a back wall and a perimeter wall. The perimeter wall is coupled to and extends forwardly from the back wall and is configured for holding the electronic device within the perimeter wall such that a display screen of the electronic device faces forwardly with respect to the case. An electromagnetic field (EMF) shield is coupled to a front side of the back wall of the case and comprises an EMF blocking material. The EMF shield is configured to block electromagnetic radiation emitted by the electronic device. A support is coupled to the case and is positioned on a back side of the back wall. The support comprises a base member and a prop, wherein the prop is pivotally coupled to the base member. The prop is movable between a retracted position and a deployed position. The retracted position is defined by the prop being positioned adjacent to the back wall, and the deployed position is defined by the prop extending rearwardly with respect to the case from the base member. The support and a bottom edge of the case are configured to be positioned on a support surface when the prop is positioned in the deployed position such that the back side of the back wall of the case forms an acute angle with the support surface. The support has an appearance of an animal, and the prop has an appearance of an appendage of the animal.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
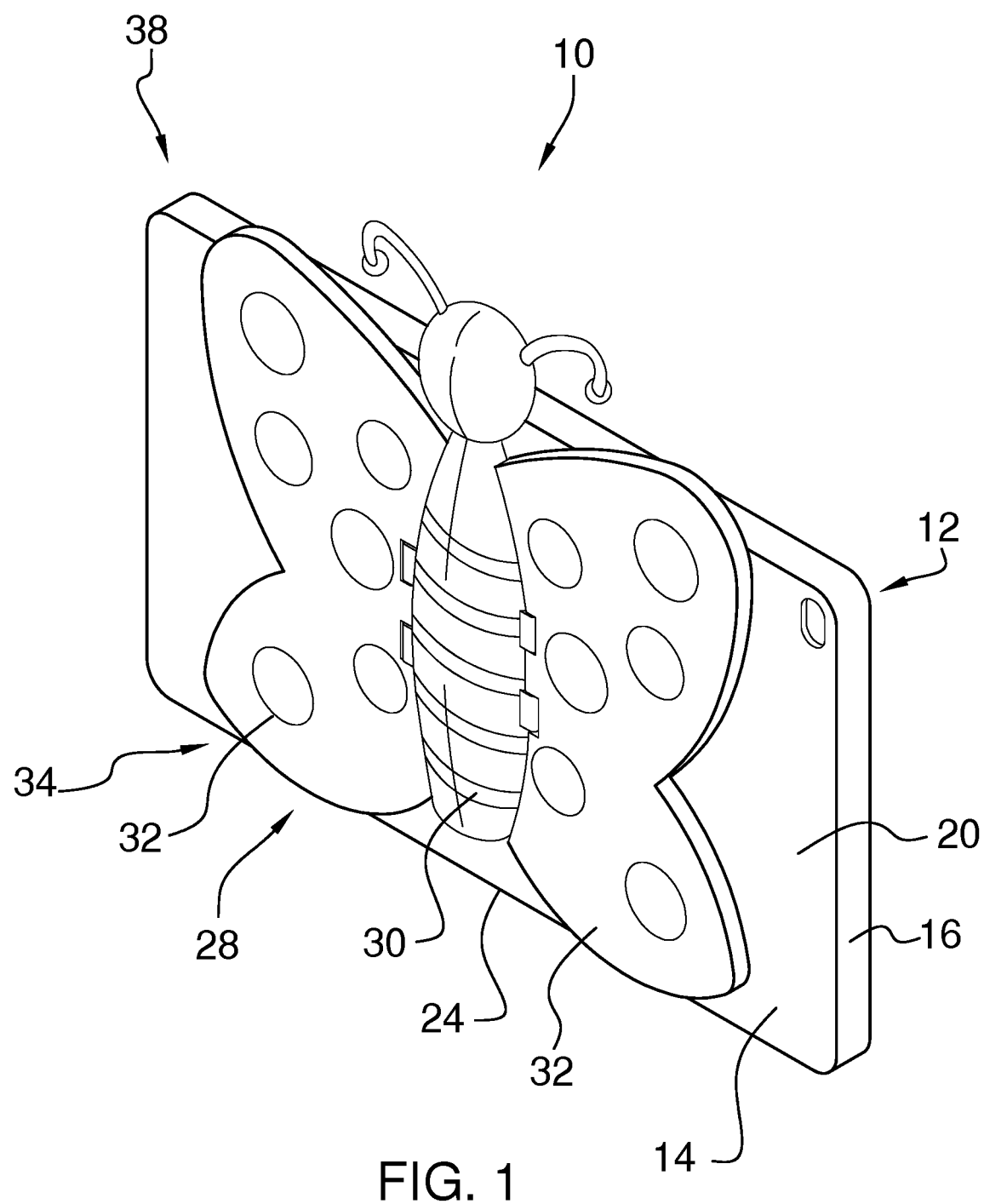
FIG. 1 is a perspective view of a display stand apparatus according to a first embodiment of the disclosure.
Figure 2:
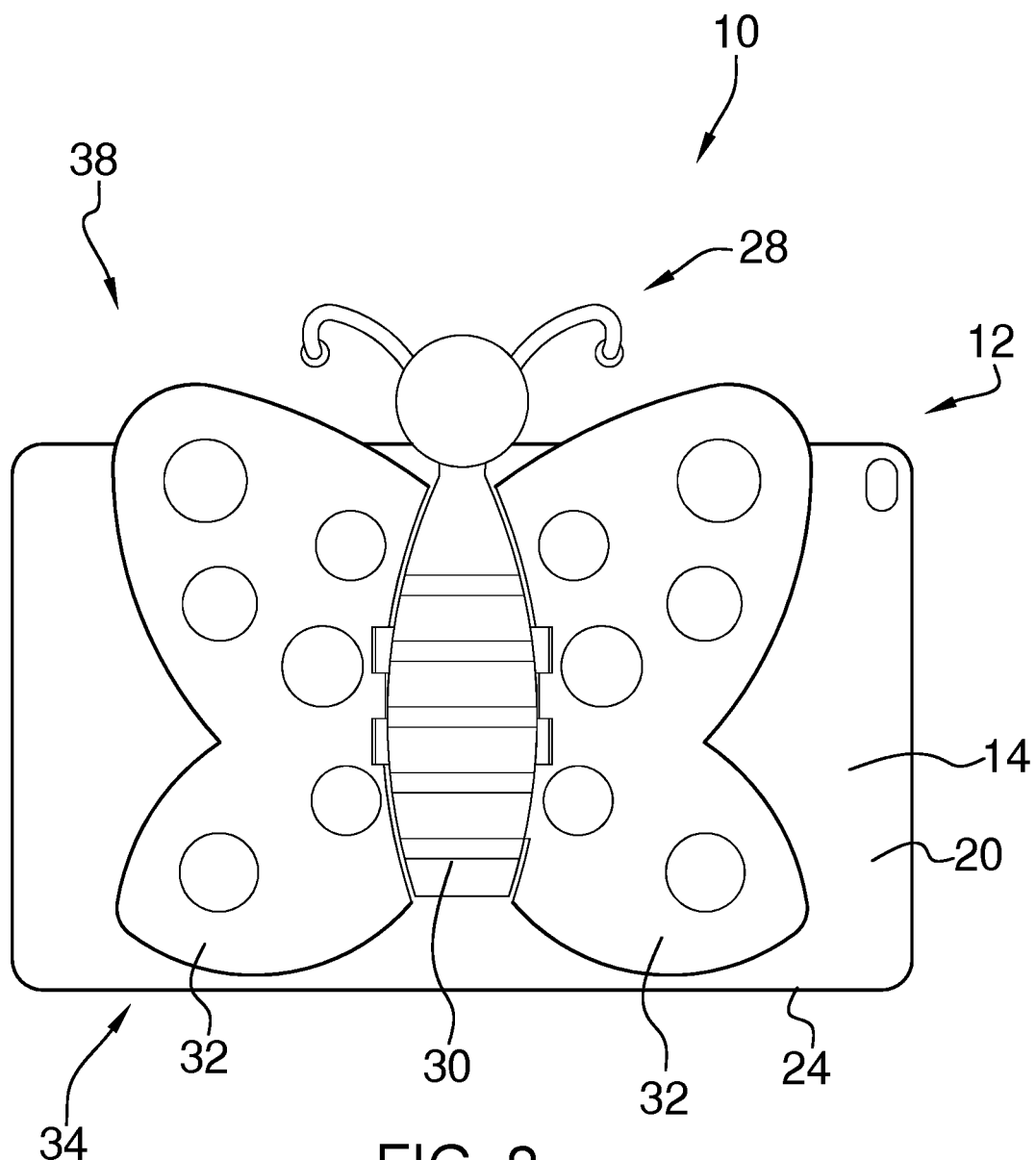
FIG. 2 is a rear view of the first embodiment of the disclosure.
Figure 3:
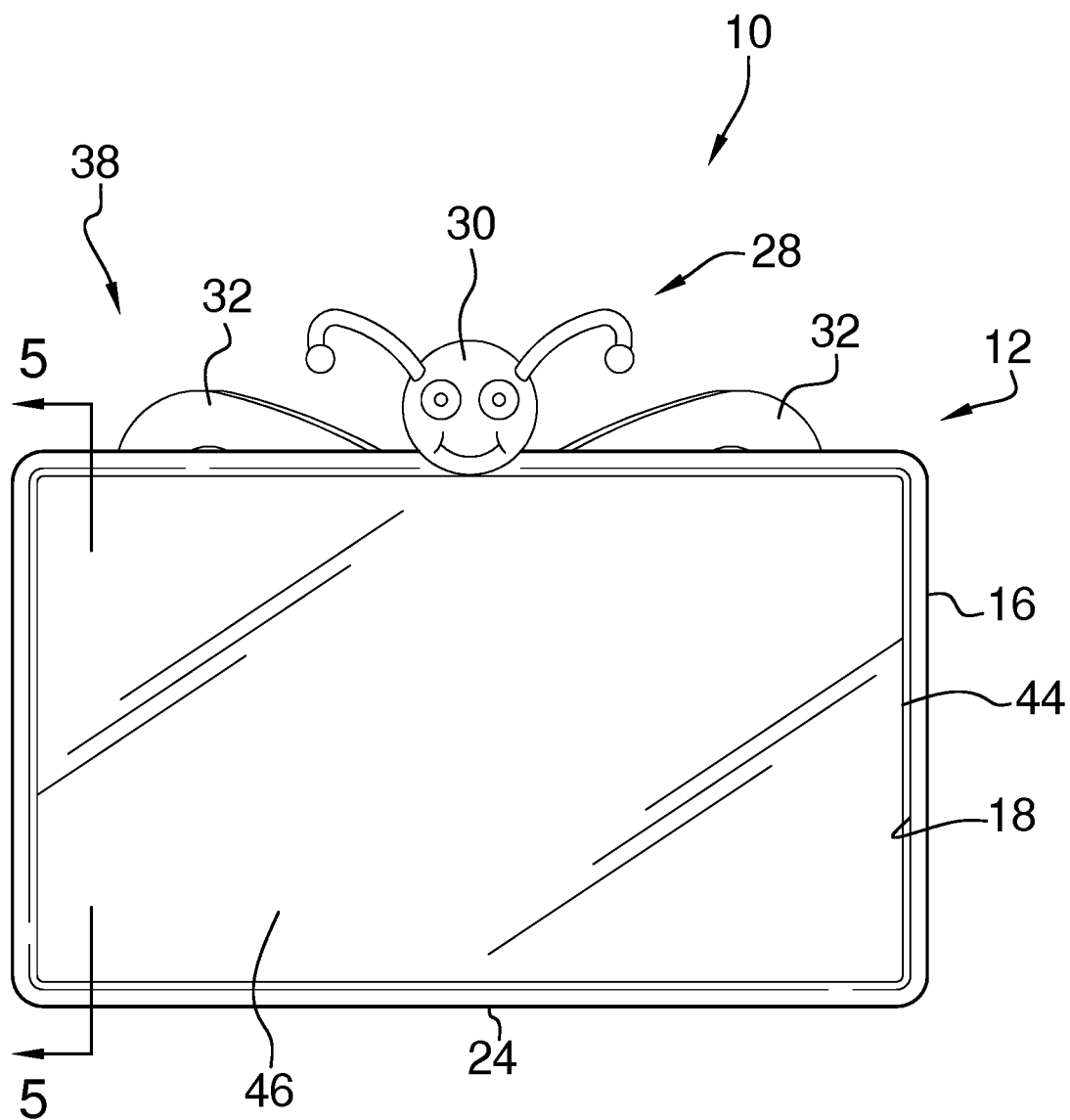
FIG. 3 is a front in-use view of the first embodiment of the disclosure.
Figure 4:
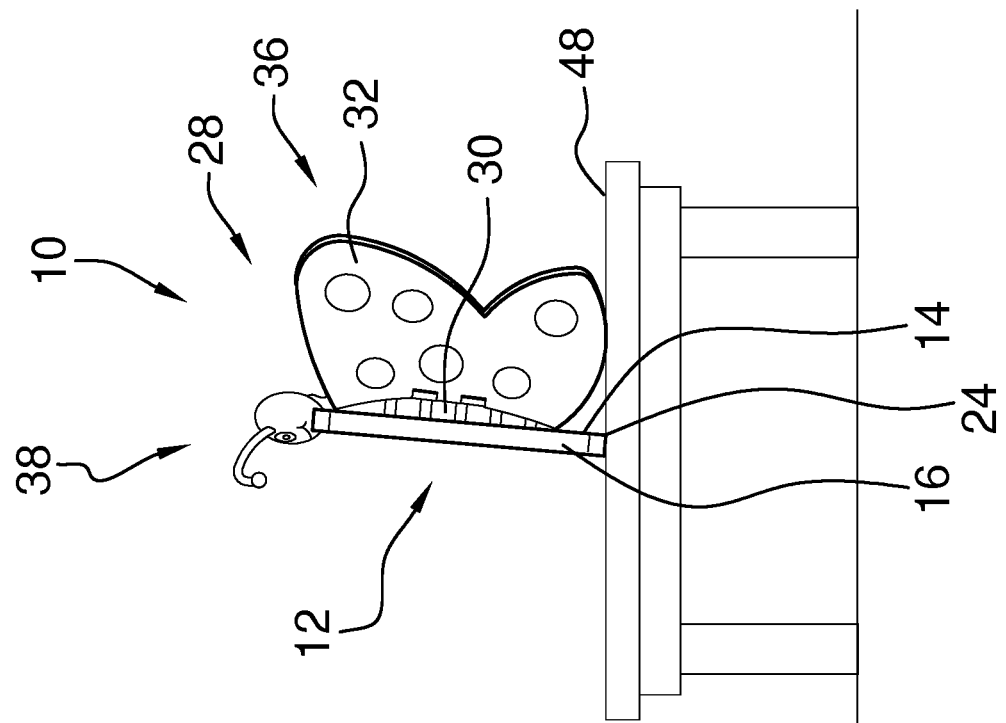
FIG. 4 is an in-use view of the first embodiment of the disclosure.
Figure 4:
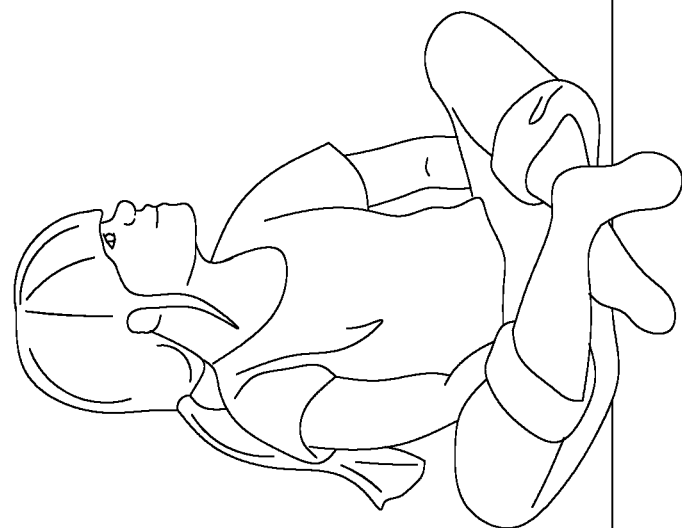
Figure 5:
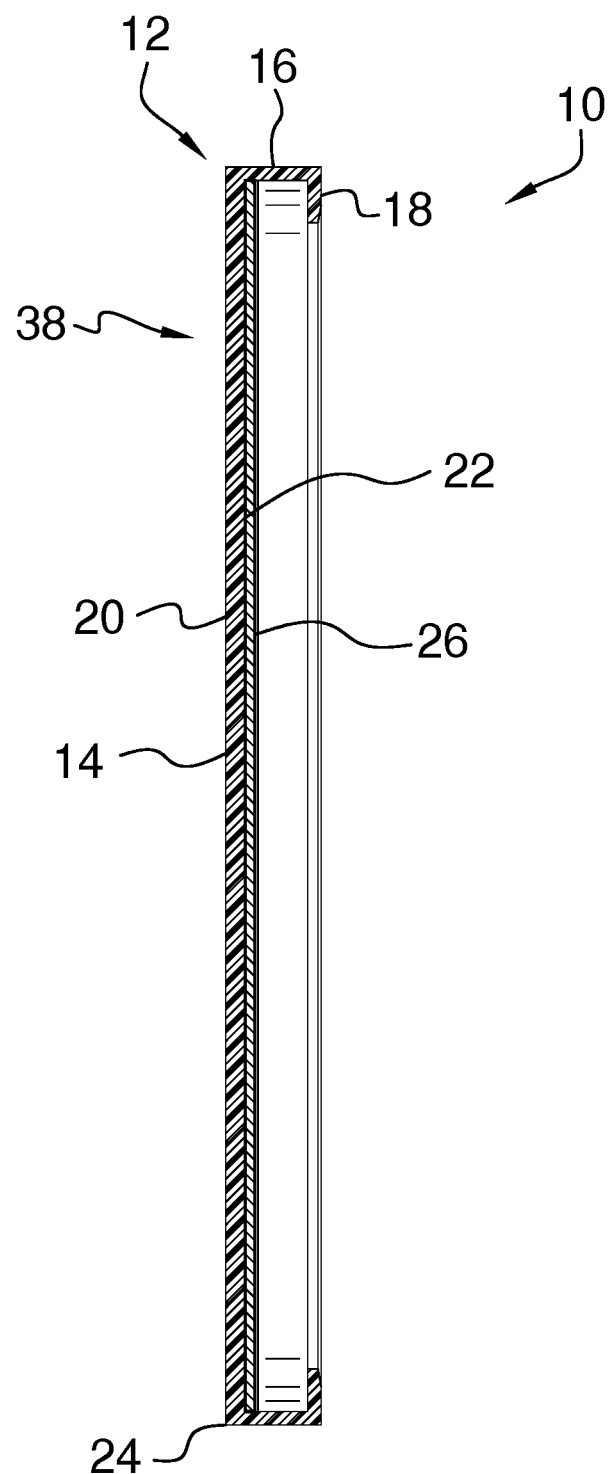
FIG. 5 is a cross-section view of the first embodiment of the disclosure taken from Arrows 5-5 in FIG. 3.
Figure 6:
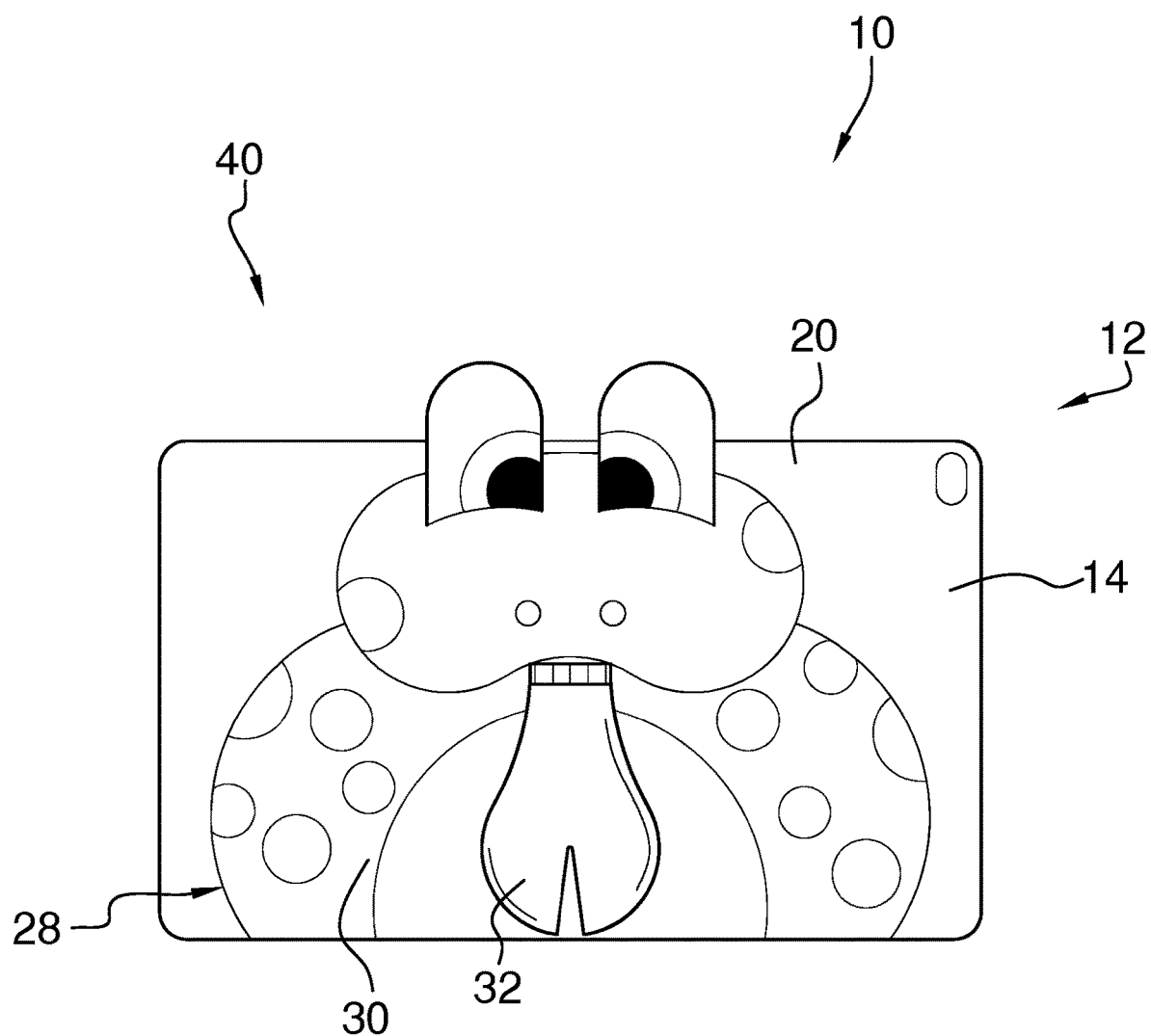
FIG. 6 is a rear view of a second embodiment of the disclosure.
Figure 7:
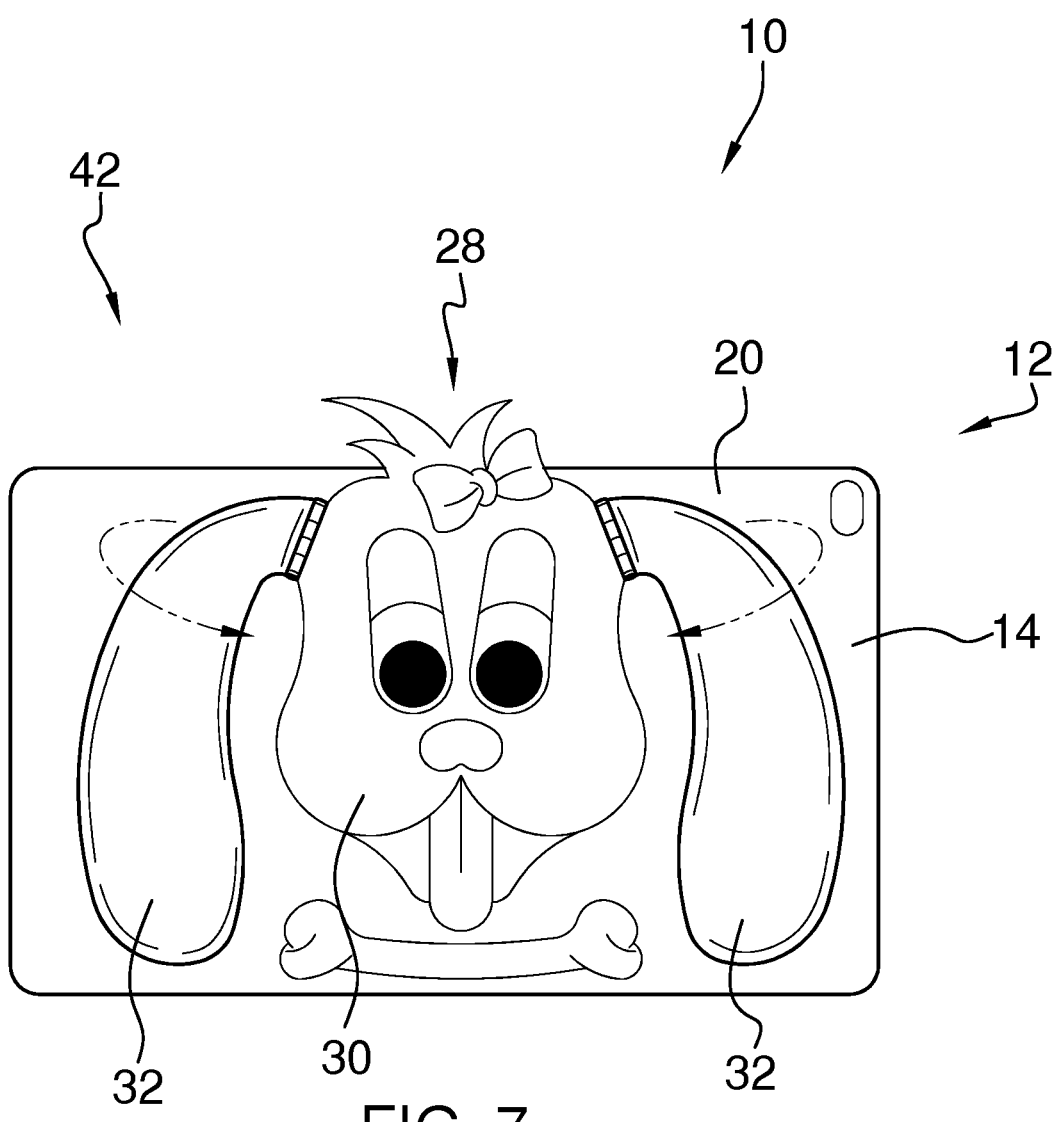
FIG. 7 is a rear view of a third embodiment of the disclosure.

With reference now to the drawings, and in particular to FIGS. 1 through 7 thereof, a new display stand apparatus embodying the principles and concepts of an embodiment of the disclosure and generally designated by the reference numeral 10 will be described.

As best illustrated in FIGS. 1 through 7, the display stand apparatus 10 generally comprises a case 12 with a back wall 14 and a perimeter wall 16. The perimeter wall 16 is coupled to and extends forwardly from the back wall 14 and is configured for holding the electronic device 44 within the perimeter wall 16 such that a display screen 46 of the electronic device 44 faces forwardly with respect to the case 12. The case 12 has a lip 18 which is coupled to a distal edge of the perimeter wall 16 with respect to the back wall 14 and extends inwardly with respect to the perimeter wall 16. The lip 18 is configured for retaining the electronic device 44 within the perimeter wall 16. The electronic device 44 may be, for example, a tablet computer, a phone, or the like.

An electromagnetic field (EMF) shield 26 is coupled to a front side 22 of the back wall 14 of the case 12 and comprises an EMF blocking material such that the EMF shield 26 is configured to block electromagnetic radiation emitted by the electronic device 44. EMF blocking materials are conductive materials which may be formed as, for example, a continuous sheet or a mesh. Electromagnetic radiation causes electric charges in the EMF blocking material to be distributed so electromagnetic effects of the electromagnetic radiation cannot act across the EMF shield 26. Conductive materials which may be used for the EMF shield 26 include copper, brass, nickel, silver, and the like.

A support 28 is coupled to the case 12 and is positioned on a back side 20 of the back wall 14. The support 28 comprises a base member 30 and a prop 32, wherein the prop 32 is pivotally coupled to the base member 30. The prop 32 is movable between a retracted position 34 and a deployed position 36. The retracted position 34 is defined by the prop 32 being positioned adjacent to the back wall 14, and the deployed position 36 is defined by the prop 32 extending rearwardly with respect to the case 12 from the base member 30. The support 28 and a bottom edge 24 of the case 12 is configured to be positioned on a support surface 48 when the prop 32 is positioned in the deployed position 36 such that the back side 20 of the back wall 14 of the case 12 forms an acute angle with the support surface 48. The support 28 has an appearance of an animal, and the prop 32 has an appearance of an appendage of the animal. Movement of the prop 32 thus simulates a movement of the appendage of the animal. The prop 32 is planar and extends parallel to the back wall 14 when the prop 32 is positioned in the retracted position 34.

In a first embodiment 38, the prop 32 is one of a pair of props 32, each of which is pivotally coupled to the base member 30. Each prop 32 of the pair of props 32 is planar and is movable between the retracted position 34 and the deployed position 36. The props 32 of the pair of props 32 are laterally spaced from each other with respect to the case 12. The props 32 of the pair of props 32 are pivotable to move toward each other when the pair of props 32 move from the retracted position 34 toward the deployed position 36. The base member 30 has an appearance of a body and a head of a butterfly, and each prop 32 of the pair of props 32 has an appearance of an associated one of a pair of wings of the butterfly.

In a second embodiment 40, the prop 32 pivots around an axis which is oriented parallel to the bottom edge 24 of the case 12. The base member 30 has an appearance of a body and a head of a frog, and the prop 32 has an appearance of a tongue of the frog.

In a third embodiment 42, the prop 32 is one of a pair of props 32. Each prop 32 of the pair of props 32 is pivotally coupled to the base member 30 and is planar. Each prop 32 of the pair of props 32 is movable between the retracted position 34 and the deployed position 36. The props 32 of the pair of props 32 are laterally spaced from each other with respect to the case 12 and are pivotable to move toward each other when the pair of props 32 move from the retracted position 34 toward the deployed position 36. The base member 30 has an appearance of a head of a dog, and each prop 32 of the pair of props 32 has an appearance of an associated one of a pair of ears of the dog.

In use, the electronic device 44 is placed in the case 12, and the EMF shield 26 blocks electromagnetic radiation emitted by the electronic device 44 toward the EMF shield 26. The stand is moved to the deployed position 36 so that the electronic device 44 may be placed on the support surface 48 such that the display screen 46 is viewable in a desirable position. The stand is moved to the retracted position 34 so that the display stand apparatus 10 collapses to a storable shape.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A display stand apparatus for an electronic device comprising:
   a case having a back wall and a perimeter wall, the perimeter wall being coupled to and extending forwardly from the back wall, the case being configured for holding the electronic device within the perimeter wall such that a display screen of the electronic device faces forwardly with respect to the case;
   an electromagnetic field shield being coupled to a front side of the back wall of the case, the electromagnetic field shield comprising an electromagnetic field blocking material, the electromagnetic field shield being configured to block electromagnetic radiation emitted by the electronic device; and
   a support being coupled to the case, the support being positioned on a back side of the back wall, the support comprising a base member and a prop, the prop being pivotally coupled to the base member, the prop being movable between a retracted position and a deployed position, the retracted position being defined by the prop being positioned adjacent to the back wall, the deployed position being defined by the prop extending rearwardly with respect to the case from the base member, the support and a bottom edge of the case being configured to be positioned on a support surface when the prop is positioned in the deployed position such that the back side of the back wall of the case forms an acute angle with the support surface, the support having an appearance of an animal, the prop having an appearance of an appendage of the animal.

2. The apparatus of claim 1, wherein the case has a lip being coupled to a distal edge of the perimeter wall with respect to the back wall and extending inwardly with respect to the perimeter wall, the lip being configured for retaining the electronic device within the perimeter wall.

3. The apparatus of claim 1, wherein the prop is planar, the prop extending parallel to the back wall when the prop is positioned in the retracted position.

4. The apparatus of claim 1, wherein the prop is one of a pair of props, each prop of the pair of props being pivotally coupled to the base member, each prop of the pair of props being planar, each prop of the pair of props being movable between the retracted position and the deployed position, the pair of props being laterally spaced from each other with respect to the case, the pair of props being pivotable to move toward each other when the pair of props move from the retracted position toward the deployed position, the base member having an appearance of a body and a head of a butterfly, each prop of the pair of props having an appearance of an associated one of a pair of wings of the butterfly.

5. The apparatus of claim 1, wherein the prop pivots around an axis which is oriented parallel to the bottom edge of the case, the base member having an appearance of a body and a head of a frog, the prop having an appearance of a tongue of the frog.

6. The apparatus of claim 1, wherein the prop is one of a pair of props, each prop of the pair of props being pivotally coupled to the base member, each prop of the pair of props being planar, each prop of the pair of props being movable between the retracted position and the deployed position, the pair of props being laterally spaced from each other with respect to the case, the pair of props being pivotable to move toward each other when the pair of props move from the retracted position toward the deployed position, the base member having an appearance of a head of a dog, each prop of the pair of props having an appearance of an associated one of a pair of ears of the dog.

7. A display stand apparatus for an electronic device comprising:
   a case having a back wall and a perimeter wall, the perimeter wall being coupled to and extending forwardly from the back wall, the case being configured for holding the electronic device within the perimeter wall such that a display screen of the electronic device faces forwardly with respect to the case, the case having a lip being coupled to a distal edge of the perimeter wall with respect to the back wall and extending inwardly with respect to the perimeter wall, the lip being configured for retaining the electronic device within the perimeter wall;
   an electromagnetic field shield being coupled to a front side of the back wall of the case, the electromagnetic field shield comprising an electromagnetic field blocking material, the electromagnetic field shield being configured to block electromagnetic radiation emitted by the electronic device; and
   a support being coupled to the case, the support being positioned on a back side of the back wall, the support comprising a base member and a prop, the prop being pivotally coupled to the base member, the prop being movable between a retracted position and a deployed position, the retracted position being defined by the prop being positioned adjacent to the back wall, the deployed position being defined by the prop extending rearwardly with respect to the case from the base member, the support and a bottom edge of the case being configured to be positioned on a support surface when the prop is positioned in the deployed position such that the back side of the back wall of the case forms an acute angle with the support surface, the support having an appearance of an animal, the prop having an appearance of an appendage of the animal, the prop being planar, the prop extending parallel to the back wall when the prop is positioned in the retracted position.

8. The apparatus of claim 7, wherein the prop is one of a pair of props, each prop of the pair of props being pivotally coupled to the base member, each prop of the pair of props being planar, each prop of the pair of props being movable between the retracted position and the deployed position, the pair of props being laterally spaced from each other with respect to the case, the pair of props being pivotable to move toward each other when the pair of props move from the retracted position toward the deployed position, the base member having an appearance of a body and a head of a butterfly, each prop of the pair of props having an appearance of an associated one of a pair of wings of the butterfly.

9. The apparatus of claim 7, wherein the prop pivots around an axis which is oriented parallel to the bottom edge of the case, the base member having an appearance of a body and a head of a frog, the prop having an appearance of a tongue of the frog.

10. The apparatus of claim 7, wherein the prop is one of a pair of props, each prop of the pair of props being pivotally coupled to the base member, each prop of the pair of props being planar, each prop of the pair of props being movable between the retracted position and the deployed position, the pair of props being laterally spaced from each other with respect to the case, the pair of props being pivotable to move toward each other when the pair of props move from the retracted position toward the deployed position, the base member having an appearance of a head of a dog, each prop of the pair of props having an appearance of an associated one of a pair of ears of the dog.

* * * * *